United States Patent
Kanbara

(10) Patent No.: US 11,136,259 B2
(45) Date of Patent: Oct. 5, 2021

(54) PHOTOSENSITIVE GLASS PASTE, ELECTRONIC COMPONENT, AND METHOD FOR PRODUCING ELECTRONIC COMPONENT

(71) Applicant: Murata Manufacturing Co., Ltd., Kyoto-fu (JP)

(72) Inventor: Hiroyuki Kanbara, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 250 days.

(21) Appl. No.: 16/219,878

(22) Filed: Dec. 13, 2018

(65) Prior Publication Data
US 2019/0112222 A1    Apr. 18, 2019

Related U.S. Application Data

(63) Continuation of application No. PCT/JP2017/024815, filed on Jul. 6, 2017.

(30) Foreign Application Priority Data

Aug. 26, 2016 (JP) .............................. JP2016-166175

(51) Int. Cl.
*C03C 4/04* (2006.01)
*C03C 8/16* (2006.01)
(Continued)

(52) U.S. Cl.
CPC ............... *C03C 4/04* (2013.01); *C03C 8/02* (2013.01); *C03C 8/16* (2013.01); *C03C 8/24* (2013.01);
(Continued)

(58) Field of Classification Search
CPC ........................................................ C03C 4/04
(Continued)

(56) References Cited

U.S. PATENT DOCUMENTS

| 5,516,733 A * | 5/1996 | Morena | C03C 3/16 |
| | | | 428/428 |
| 6,355,586 B1 * | 3/2002 | Usui | C03C 8/08 |
| | | | 501/15 |

(Continued)

FOREIGN PATENT DOCUMENTS

| JP | H10-229016 A | 8/1998 |
| JP | 2001229838 A | 8/2001 |

(Continued)

OTHER PUBLICATIONS

International Search Report issued in PCT/JP2017/024815; dated Oct. 10, 2017.

(Continued)

*Primary Examiner* — Lauren R Colgan
(74) *Attorney, Agent, or Firm* — Studebaker & Brackett PC

(57) ABSTRACT

A photosensitive glass paste contains a photosensitive organic component, and an inorganic component containing a glass powder and a ceramic filler. The glass powder contains a glass powder having a crystallization point. The difference between the crystallization point and the softening point of the glass powder having a crystallization point is from 85° C. to 180° C. The glass powder having a crystallization point is preferably a $SiO_2$—$B_2O_3$—BaO—ZnO—$Al_2O_3$—MgO—$La_2O_3$ glass powder.

13 Claims, 2 Drawing Sheets

(51) Int. Cl.
*C03C 8/24* (2006.01)
*G03F 7/027* (2006.01)
*C03C 8/02* (2006.01)
*G03F 7/004* (2006.01)
*G03F 7/029* (2006.01)
*H05K 1/03* (2006.01)
*H05K 3/46* (2006.01)

(52) U.S. Cl.
CPC ............ *G03F 7/0047* (2013.01); *G03F 7/027* (2013.01); *G03F 7/029* (2013.01); *H05K 1/0306* (2013.01); *H05K 3/4664* (2013.01); *H05K 2203/1126* (2013.01)

(58) Field of Classification Search
USPC ........................................................ 428/426
See application file for complete search history.

(56) References Cited

U.S. PATENT DOCUMENTS

| | | | | |
|---|---|---|---|---|
| 8,003,217 | B2* | 8/2011 | Rosenflanz | C03B 32/02 428/426 |
| 2001/0014429 | A1* | 8/2001 | Iha | C03C 8/16 430/270.1 |
| 2001/0033219 | A1* | 10/2001 | Iha | G03F 7/0047 336/90 |
| 2002/0035194 | A1* | 3/2002 | Tose | C03C 8/14 524/492 |
| 2003/0141817 | A1* | 7/2003 | Shinoda | H01J 11/12 313/587 |
| 2004/0138045 | A1* | 7/2004 | Komatsudani | C03C 14/004 501/79 |
| 2005/0130547 | A1* | 6/2005 | Oida | H01J 9/02 445/24 |
| 2006/0223690 | A1* | 10/2006 | Mutoh | G03F 7/0047 501/75 |
| 2009/0004597 | A1* | 1/2009 | Ueoka | G03F 7/0047 430/270.1 |
| 2010/0060162 | A1* | 3/2010 | Lee | C03C 3/17 313/582 |

FOREIGN PATENT DOCUMENTS

| | | |
|---|---|---|
| JP | 200589289 A | 4/2005 |
| JP | 2006-126716 A | 5/2006 |
| JP | 200719018 A | 1/2007 |
| JP | 2007119339 A | 5/2007 |
| JP | 2008156551 A | 7/2008 |
| JP | 2009263179 A | 11/2009 |
| JP | 2013203627 A | 10/2013 |
| JP | 2014019585 A | 2/2014 |
| JP | 2015086118 A | 5/2015 |
| WO | 2008/093669 A1 | 8/2008 |
| WO | 2016/076024 A1 | 5/2016 |

OTHER PUBLICATIONS

Written Opinion of the International Searching Authority issued in PCT/JP2017/024815; dated Oct. 10, 2017.

* cited by examiner

PHOTOSENSITIVE GLASS PASTE, ELECTRONIC COMPONENT, AND METHOD FOR PRODUCING ELECTRONIC COMPONENT

CROSS-REFERENCE TO RELATED APPLICATIONS

This application claims benefit of priority to International Patent Application No. PCT/JP2017/024815, filed Jul. 6, 2017, and to Japanese Patent Application No. 2016-166175, filed Aug. 26, 2016, the entire contents of each are incorporated herein by reference.

BACKGROUND

Technical Field

The present disclosure relates to a photosensitive glass paste, an electronic component, and a method for producing an electronic component.

Background Art

An insulating paste containing an organic component and an inorganic component containing a glass powder has been used as an insulating material for boards, such as multi-wire circuit boards, and electronic components. Japanese Unexamined Patent Application Publication No. 2006-126716 discloses a photosensitive insulating paste containing at least a silica powder, a glass powder, and a photosensitive organic component. The glass powder contains a low-melting-point glass having a softening point of 350° C. to 550° C. and a high-melting-point glass having a softening point of 600° C. to 900° C. The high-melting-point glass has a relative permittivity of 8 or less.

SUMMARY

The photosensitive insulating paste described in Japanese Unexamined Patent Application Publication No. 2006-126716 is used as insulating layers in, for example, multi-wire circuit boards. Such an insulating layer is formed mainly on an alumina substrate. The photosensitive insulating paste described in Japanese Unexamined Patent Application Publication No. 2006-1267161 can provide an insulating layer having high insulating performance, that is, high electrical resistance because of the presence of a glass powder containing two types of glass having different softening points.

However, the inventors of the present disclosure have studied a multi-wire circuit board including insulating layers formed of the photosensitive insulating paste described in Japanese Unexamined Patent Application Publication No. 2006-126716, and have found that the insulating layers are cracked when the stress, such as deformation or thermal shock, acts on the circuit, causing a difficulty in ensuring insulating properties.

The present disclosure is directed to a photosensitive glass paste that can form an insulating layer having high insulating performance and high strength. The present disclosure is also directed to an electronic component including an insulating layer formed by using the photosensitive glass paste, and to a method for producing an electronic component including a step of forming an insulating layer by using the photosensitive glass paste.

A photosensitive glass paste of the present disclosure contains a photosensitive organic component and an inorganic component containing a glass powder and a ceramic filler. The glass powder contains a glass powder having a crystallization point. The difference between the crystallization point and the softening point of the glass powder having a crystallization point is 85° C. or more and 180° C. or less (i.e., from 85° C. to 180° C.). The glass powder having a crystallization point is preferably a $SiO_2$—$B_2O_3$—$BaO$—$ZnO$—$Al_2O_3$—$MgO$—$La_2O_3$ glass powder.

The glass powder having a crystallization point present as an inorganic component in the photosensitive glass paste can increase the strength of an insulating layer formed by firing the photosensitive glass paste. Moreover, the difference between the crystallization point and the softening point of the glass powder having a crystallization point in the photosensitive glass paste is as large as 85° C. or more and 180° C. or less (i.e., from 85° C. to 180° C.). Due to this property, the glass starts to crystallize after it softens well during firing, which provides a dense crystal structure. As a result, the formed insulating layer has insulating properties and high strength.

In particular, the use of a $SiO_2$—$B_2O_3$—$BaO$—$ZnO$—$Al_2O_3$—$MgO$—$La_2O_3$ glass powder as the glass powder having a crystallization point allows deposition of a dense crystal phase having high strength and thus can further improve the strength of the insulating layer.

The photosensitive glass paste of the present disclosure contains a photosensitive organic component and an inorganic component containing a glass powder and a ceramic filler. The glass powder contains a glass powder having a crystallization point. The glass powder having a crystallization point is one selected from the group consisting of a $SiO_2$—$B_2O_3$—$BaO$—$ZnO$—$Al_2O_3$—$MgO$—$La_2O_3$ glass powder, a $SiO_2$—$B_2O_3$—$CaO$—$Al_2O_3$ glass powder, and a $SiO_2$—$B_2O_3$—$CaO$—$Al_2O_3$—$Na_2O$—$K_2O$ glass powder.

Since the photosensitive glass paste contains a glass powder having a crystallization point as an inorganic component, an insulating layer formed by firing the photosensitive glass paste has high strength. The photosensitive glass paste contains a $SiO_2$—$B_2O_3$—$BaO$—$ZnO$—$Al_2O_3$—$MgO$—$La_2O_3$ glass powder, a $SiO_2$—$B_2O_3$—$CaO$—$Al_2O_3$ glass powder, or a $SiO_2$—$B_2O_3$—$CaO$—$Al_2O_3$—$Na_2O$—$K_2O$ glass powder as a glass powder of which the difference between the crystallization point and the softening point is large. For this, the glass starts to crystallize after it softens well during firing, which provides a dense crystal structure. As a result, the formed insulating layer has insulating properties and high strength.

In the photosensitive glass paste of the present disclosure, the proportion of the glass powder having a crystallization point in the entirety of the glass powder is preferably 80 wt % or more. When the proportion of the glass powder having a crystallization point in the entirety of the glass powder is 80 wt % or more, an insulating layer having higher strength can be formed.

In the photosensitive glass paste of the present disclosure, the ceramic filler is preferably at least one selected from the group consisting of alumina, zirconia, partially stabilized zirconia, silicon nitride, and silicon carbide. When alumina, zirconia, partially stabilized zirconia, silicon nitride, or silicon carbide, which has a high Young's modulus and a high flexural strength, is used as a ceramic filler, the insulating layer has higher strength.

In the photosensitive glass paste of the present disclosure, the amount of the ceramic filler in the inorganic component is preferably 25 wt % or more and 48 wt % or less (i.e., from 25 wt % to 48 wt %). When the amount of the ceramic filler in the inorganic component is 25 wt % or more and 48 wt % or less (i.e., from 25 wt % to 48 wt %), the ceramic filler can contribute to high strength, and thus the insulating layer has higher strength.

The electronic component of the present disclosure includes a conductor layer and an insulating layer formed of a fired product of the photosensitive glass paste of the present disclosure.

The use of the photosensitive glass paste of the present disclosure can form an insulating layer having high insulating performance and high strength. This provides an electronic component, such as a multi-wire circuit board, in which insulating layers are unlikely to be cracked even if the stress acts on an electronic component, such as a multi-wire circuit board.

The electronic component of the present disclosure preferably further includes an insulating layer formed of an amorphous glass having no crystallization point. The insulating layer formed of an amorphous glass having no crystallization point has good insulating properties. For this, the electronic component of the present disclosure may be configured such that, for example, an insulating layer formed of a fired product of the photosensitive glass paste of the present disclosure is disposed in a part susceptible to the stress and an insulating layer formed of an amorphous glass having no crystallization point is disposed in other part.

A method for producing the electronic component of the present disclosure includes a step of forming an insulating layer by using the photosensitive glass paste of the present disclosure, and a step of forming a conductor layer on the insulating layer by using a conductor paste.

The use of the photosensitive glass paste of the present disclosure can form an insulating layer having high insulating performance and high strength. This enables production of an electronic component, such as a multi-wire circuit board, in which insulating layers are unlikely to be cracked even if the stress acts on the electronic component.

According to the present disclosure, there is provided a photosensitive glass paste that can form an insulating layer having high insulating performance and high strength.

DETAILED DESCRIPTION

Figure 1:
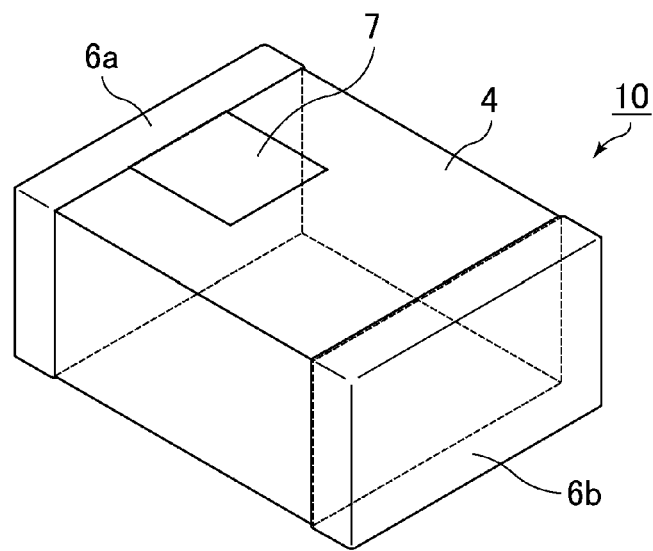
FIG. 1 is a perspective view schematically illustrating an example electronic component.

A photosensitive glass paste, an electronic component, and a method for producing an electronic component according to the present disclosure will be described below. However, the present disclosure is not limited to the following configurations and can be modified as appropriate and applied without departing from the spirit of the present disclosure. Note that a combination of two or more individual preferred configurations of the present disclosure described below is also within the present disclosure.

[Photosensitive Glass Paste]

The photosensitive glass paste of the present disclosure contains a photosensitive organic component and an inorganic component containing a glass powder and a ceramic filler.

<Inorganic Component>
(Glass Powder)

In the photosensitive glass paste of the present disclosure, the glass powder contains a glass powder having a crystallization point. The glass powder may contain two or more glass powders. In this case, the glass powder may contain two or more glass powders each having a crystallization point, or may contain a glass powder having a crystallization point and a glass powder having no crystallization point.

The proportion of the glass powder having a crystallization point in the entirety of the glass powder is preferably 80 wt % or more, more preferably 87 wt % or more, and still more preferably 100 wt %. The amount of the glass powder in the inorganic component is preferably 52 wt % or more, more preferably 58 wt % or more, and preferably 75 wt % or less, more preferably 70 wt % or less.

In the photosensitive glass paste of the present disclosure, in a first aspect, the difference between the crystallization point and the softening point of the glass powder having a crystallization point is 85° C. or more and 180° C. or less (i.e., from 85° C. or more and 180° C.). The expression "the difference between the crystallization point and the softening point of the glass powder having a crystallization point is 85° C. or more and 180° C. or less" means that 85≤Tc−Ts≤180, where Tc [° C.] represents the crystallization point of the glass powder having a crystallization point, and Ts [° C.] represents the softening point of the glass powder having a crystallization point.

In the first aspect, the difference between the crystallization point and the softening point of the glass powder having a crystallization point is preferably 90° C. or more, and more preferably 100° C. or more. The difference between the crystallization point and the softening point of the glass powder having a crystallization point is preferably 160° C. or less, and more preferably 140° C. or less.

In this specification, the crystallization point and the softening point of the glass powder are temperatures determined by using a differential thermal analyzer (TG-DTA2000 available from Mac Science) on the basis of the exothermic and endothermic behaviors during heating at 10° C./min in the atmosphere. The crystallization point is an exothermic peak temperature of crystal deposition, whereas the softening point is a temperature at the fourth inflection point.

In the first aspect, the crystallization point and the softening point of the glass powder can be controlled by, for example, changing the composition, the average particle size, or the like of the glass powder. In the first aspect, the crystallization point of the glass powder having a crystallization point is not limited, but preferably 860° C. or higher, more preferably 870° C. or higher, and preferably 900° C. or lower, more preferably 890° C. or lower.

In the first aspect, the softening point of the glass powder having a crystallization point is not limited, but preferably 710° C. or higher, more preferably 720° C. or higher, and preferably 810° C. or lower, more preferably 800° C. or lower. In the first aspect, examples of the glass powder having a crystallization point include, but are not limited to, a $SiO_2$—$B_2O_3$—$BaO$—$ZnO$—$Al_2O_3$—$MgO$—$La_2O_3$ glass powder, a $SiO_2$—$B_2O_3$—$CaO$—$Al_2O_3$ glass powder, and a $SiO_2$—$B_2O_3$—$CaO$—$Al_2O_3$—$Na_2O$—$K_2O$ glass powder. Among these powders, a $SiO_2$—$B_2O_3$—$BaO$—$ZnO$—$Al_2O_3$—$MgO$—$La_2O_3$ glass powder is preferred.

In this specification, for example, a glass powder having constituent elements of Si, B, Ba, Zn, Al, Mg, La, and O is expressed as a "$SiO_2$—$B_2O_3$—$BaO$—$ZnO$—$Al_2O_3$—$MgO$—$La_2O_3$ glass powder" in terms of oxide composition.

However, the valences of the metals in the glass powder are not limited to the above-described valences, and may be different valences.

The preferred amount of each component in the $SiO_2$—$B_2O_3$—$BaO$—$ZnO$—$Al_2O_3$—$MgO$—$La_2O_3$ glass powder in terms of oxide composition is described below.

$SiO_2$: 10 wt % or more, 20 wt % or less (i.e., from 10 wt % to 20 wt %)

$B_2O_3$: 10 wt % or more, 20 wt % or less (i.e., from 10 wt % to 20 wt %)

$BaO$: 10 wt % or more, 20 wt % or less (i.e., from 10 wt % to 20 wt %)

$ZnO$: 10 wt % or more, 20 wt % or less (i.e., from 10 wt % to 20 wt %)

$Al_2O_3$: 1 wt % or more, 10 wt % or less (i.e., from 1 wt % to 10 wt %)

$MgO$: 10 wt % or more, 20 wt % or less (i.e., from 10 wt % to 20 wt %)

$La_2O_3$: 10 wt % or more, 20 wt % or less (i.e., from 10 wt % to 20 wt %)

The preferred amount of each component in the $SiO_2$—$B_2O_3$—$CaO$—$Al_2O_3$ glass powder in terms of oxide composition is described below.

$SiO_2$: 40 wt % or more, 50 wt % or less (i.e., from 40 wt % to 50 wt %)

$B_2O_3$: 1 wt % or more, 10 wt % or less (i.e., from 1 wt % to 10 wt %)

$CaO$: 40 wt % or more, 50 wt % or less (i.e., from 40 wt % to 50 wt %)

$Al_2O_3$: 1 wt % or more, 10 wt % or less (i.e., from 1 wt % to 10 wt %)

The preferred amount of each component in the $SiO_2$—$B_2O_3$—$CaO$—$Al_2O_3$—$Na_2O$—$K_2O$ glass powder in terms of oxide composition is described below.

$SiO_2$: 40 wt % or more, 50 wt % or less (i.e., from 40 wt % to 50 wt %)

$B_2O_3$: 1 wt % or more, 10 wt % or less (i.e., from 1 wt % to 10 wt %)

$CaO$: 40 wt % or more, 50 wt % or less (i.e., from 40 wt % to 50 wt %)

$Al_2O_3$: 1 wt % or more, 10 wt % or less (i.e., from 1 wt % to 10 wt %)

$Na_2O$: 1 wt % or more, 10 wt % or less (i.e., from 1 wt % to 10 wt %)

$K_2O$: 1 wt % or more, 10 wt % or less (i.e., from 1 wt % to 10 wt %)

In the first aspect, examples of the glass powder having no crystallization point include, but are not limited to, a $SiO_2$—$B_2O_3$—$Na_2O$—$K_2O$—$CaO$—$Al_2O_3$ glass powder and a $SiO_2$—$B_2O_3$—$Na_2O$—$K_2O$—$Al_2O_3$ glass powder.

In the photosensitive glass paste of the present disclosure, in a second aspect, the glass powder having a crystallization point is one selected from the group consisting of a $SiO_2$—$B_2O_3$—$BaO$—$ZnO$—$Al_2O_3$—$MgO$—$La_2O_3$ glass powder, a $SiO_2$—$B_2O_3$—$CaO$—$Al_2O_3$ glass powder, and a $SiO_2$—$B_2O_3$—$CaO$—$Al_2O_3$—$Na_2O$—$K_2O$ glass powder. Among these powders, a $SiO_2$—$B_2O_3$—$BaO$—$ZnO$—$Al_2O_3$—$MgO$—$La_2O_3$ glass powder is preferred. The preferred amount of each component in each glass powder is the same as that in the first aspect.

(Ceramic Filler)

In this specification, the term ceramic filler refers to a ceramic filler that is an aggregate for forming a structure having high form accuracy and high dimensional accuracy and does not melt during firing of the paste.

Examples of the ceramic filler in the photosensitive glass paste of the present disclosure include alumina, zirconia, partially stabilized zirconia, silicon nitride, silicon carbide, and quartz. These ceramic fillers may be used as a mixture of two or more. Among these, at least one selected from the group consisting of alumina, zirconia, partially stabilized zirconia, silicon nitride, and silicon carbide is preferred, and alumina is more preferred.

The amount of the ceramic filler in the inorganic component is preferably 25 wt % or more, more preferably 30 wt % or more, and preferably 48 wt % or less, more preferably 42 wt % or less. The amount of the inorganic component in the photosensitive glass paste of the present disclosure is preferably 53 wt % or more, more preferably 62 wt % or more, and preferably 75 wt % or less, more preferably 67 wt % or less.

<Organic Component>

The photosensitive organic component in the photosensitive glass paste of the present disclosure preferably contains, for example, an alkali soluble polymer, a photosensitive monomer, a photopolymerization initiator, and a solvent.

Examples of the alkali soluble polymer include polymers having a functional group, such as a carboxyl group, in the side chain. Specific examples include methacrylic acid-methyl methacrylate copolymer. The acid number of the alkali soluble polymer is preferably 0 mgKOH/g or more and 57 mgKOH/g or less (i.e., from 0 mgKOH/g to 57 mgKOH/g).

With regard to the photosensitive monomer, the photopolymerization initiator, and the solvent, various substances can be used without any limitation. The amount of the organic component in the photosensitive glass paste of the present disclosure is preferably 25 wt % or more, more preferably 33 wt % or more, and preferably 47 wt % or less, more preferably 38 wt % or less.

[Electronic Component]

The electronic component of the present disclosure includes a conductor layer and an insulating layer formed of a fired product of the photosensitive glass paste of the present disclosure.

An example electronic component will be described below.

Figure 2:
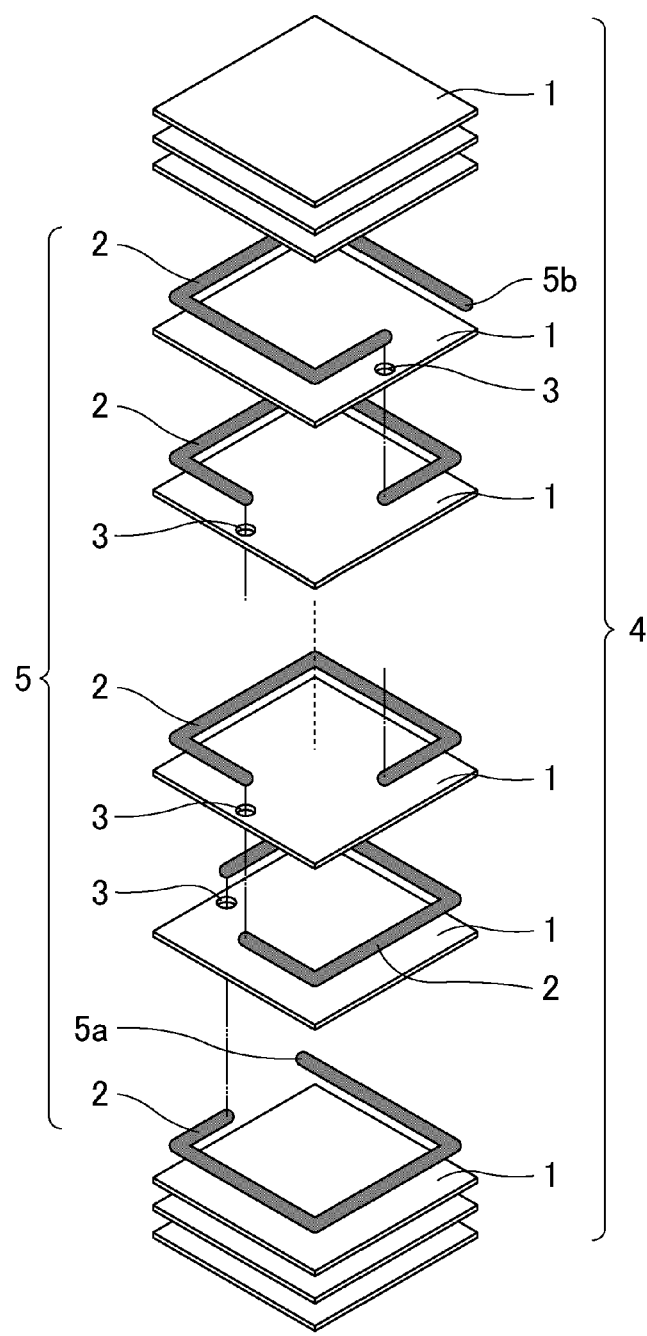
FIG. 2 is an exploded perspective view illustrating the internal structure of a multilayer body in the electronic component illustrated in FIG. 1.

FIG. 1 is a perspective view schematically illustrating an example electronic component. FIG. 2 is an exploded perspective view illustrating the internal structure of a multilayer body in the electronic component illustrated in FIG. 1.

A multilayer coil component is described below as an example electronic component. However, the electronic component of the present disclosure is not limited to the multilayer coil component and can be applied to various electronic components, such as multilayer ceramic substrates and multilayer LC composite components.

An electronic component (multilayer coil component) 10 illustrated in FIG. 1 has a multilayer body 4. In the multilayer body 4, as illustrated in FIG. 2, a spiral coil 5 is formed as follows: conductor layers 2 are stacked with insulating layers 1, which are formed by using the photosensitive glass paste of the present disclosure, each interposed therebetween; and the conductor layers 2 are connected to each other through via-holes 3.

In FIG. 1, outer electrodes 6a and 6b are respectively disposed at the left and right opposed end portions of the multilayer body 4 and are respectively in electrical communication with end portions 5a and 5b of the coil 5 (see FIG. 2), and an orientation mark pattern 7 for indicating the orientation of the multilayer coil component 10 is disposed on the upper surface of the multilayer body 4. The orientation mark pattern 7 is not necessarily disposed.

The electronic component of the present disclosure may include, as insulating layers, only the insulating layers formed by using the photosensitive glass paste of the present disclosure, but preferably further includes an insulating layer formed of an amorphous glass having no crystallization point.

The insulating layer formed of an amorphous glass having no crystallization point is preferably an insulating layer formed of a fired product of a photosensitive glass paste in which only a glass powder having no crystallization point is present as a glass powder and that does not contain a glass powder having a crystallization point. Examples of the glass powder having no crystallization point include, but are not limited to, a $SiO_2$—$B_2O_3$—$Na_2O$—$K_2O$—$CaO$—$Al_2O_3$ glass powder and a $SiO_2$—$B_2O_3$—$Na_2O$—$K_2O$—$Al_2O_3$ glass powder.

In electronic components, insulating layers in contact with outer electrodes among insulating layers are most susceptible to cracking. For this, at least the insulating layers in contact with the outer electrodes are preferably insulating layers formed of a fired product of the photosensitive glass paste of the present disclosure. Specifically, at least one of the insulating layer on the upper surface of the multilayer body in the electronic component and the insulating layer on the lower surface of the multilayer body is preferably an insulating layer formed of a fired product of the photosensitive glass paste of the present disclosure. The lower surface is a surface that is to face a circuit board when the electronic component is mounted on the circuit board. The lower surface of the multilayer body in the electronic component is most susceptible to the stress from the circuit board and likely to be cracked. Therefore, at least the insulating layer that constitutes the lower surface of the multilayer body is preferably an insulating layer formed of a fired product of the photosensitive glass paste of the present disclosure. In this case, the insulating layers other than the insulating layers on the upper surface and the lower surface of the multilayer body may be insulating layers formed of a fired product of the photosensitive glass paste of the present disclosure, but preferably insulating layers formed of an amorphous glass having no crystallization point.

In the electronic component of the present disclosure, the proportion of the film thickness of the insulating layers formed of a fired product of the photosensitive glass paste of the present disclosure with respect to the total film thickness of the insulating layers formed of a fired product of the photosensitive glass paste of the present disclosure and the insulating layers formed of an amorphous glass having no crystallization point is preferably 10% or more and 40% or less (i.e., from 10% to 40%).

[Method for Producing Electronic Component]

A method for producing the electronic component of the present disclosure includes a step of forming an insulating layer by using the photosensitive glass paste of the present disclosure, and a step of forming a conductor layer on the insulating layer by using a conductor paste.

An example method for producing an electronic component will be described below.

First, an insulating layer serving as an outer layer is formed on a substrate, such as a PET film. In forming the insulating layer, a process including applying a photosensitive glass paste to the substrate, drying the paste, and then exposing the entire surface to light is repeated until a desired thickness is obtained.

Next, to the hardened insulating layer, a photosensitive conductive paste is applied at a thickness of about 10 μm and dried. Subsequently, the resulting layer is exposed to ultraviolet radiation through a photomask, and unnecessary parts are removed by developing to form a conductor layer.

Next, to the conductor layer, the photosensitive glass paste is applied at a thickness of about 15 μm. Subsequently, the resulting layer is exposed to ultraviolet radiation through a photomask, and unnecessary parts are removed by developing to form an insulating layer having a via-hole.

The foregoing formation of a conductor layer and an insulating layer is repeated necessary times to form a multilayer body.

Next, the multilayer body is fired in the atmosphere at a temperature of 750° C. or higher and 900° C. or lower (i.e., from 750° C. to 900° C.). A paste containing Ag powder and glass frit is applied to the end surfaces of the sintered multilayer body and baked at a temperature of 600° C. or higher and 750° C. or lower (i.e., from 600° C. to 750° C.). As needed, Ni plating and Sn plating are performed in sequence by means of electroplating to form outer electrodes. The electronic component is produced accordingly.

In the method for producing an electronic component according to the present disclosure, the insulating layers in the multilayer body may be formed by using an amorphous photosensitive glass paste, instead of using the photosensitive glass paste of the present disclosure. The term amorphous photosensitive glass paste refers to a photosensitive glass paste that contains a glass powder having no crystallization point and does not contain a glass powder having a crystallization point, as described for the electronic component of the present disclosure.

In the method for producing an electronic component according to the present disclosure, at least the insulating layers in contact with the outer electrodes are preferably formed by using the photosensitive glass paste of the present disclosure, as described for the electronic component of the present disclosure. Specifically, at least one of the insulating layer on the upper surface of the multilayer body in the electronic component and the insulating layer on the lower surface of the multilayer body is preferably formed by using the photosensitive glass paste of the present disclosure. In particular, at least the insulating layer that constitutes the lower surface of the multilayer body is preferably formed by using the photosensitive glass paste of the present disclosure. In this case, the insulating layers other than the insulating layers on the upper surface and the lower surface of the multilayer body may be formed by using the photosensitive glass paste of the present disclosure, but preferably formed by using an amorphous photosensitive glass paste.

In the method for producing an electronic component according to the present disclosure, the proportion of the film thickness of the insulating layers formed by using the photosensitive glass paste of the present disclosure with respect to the total film thickness of the insulating layers formed by using the photosensitive glass paste of the present disclosure and the insulating layers formed by using an amorphous photosensitive glass paste is preferably 10% or more and 40% or less (i.e., from 10% to 40%).

Examples

Examples where the photosensitive glass paste of the present disclosure is more specifically disclosed will be described below. The present disclosure is not limited only to these Examples.

The glass powders shown in Table 1 and the ceramic fillers shown in Table 2 were provided. Table 1 shows the softening point (Ts), the crystallization point (Tc), and the difference (Tc−Ts) between the crystallization point and the softening point of each glass powder. In Table 1, G5 and G6 are glass powders that have the same amount of each component but have a softening point and a crystallization point that are controlled by changing the average particle size.

TABLE 1

| Sample no. | Constituent elements | Ts [° C.] | Tc [° C.] | Tc − Ts [° C.] |
|---|---|---|---|---|
| G1 | Si—Ba—Zn—Al—O | 810 | 850 | 40 |
| G2 | Si—B—Ca—Al—O | 800 | 900 | 100 |
| G3 | Si—Li—Ca—Ba—Zn—Al—Sn—Zr—O | 810 | 890 | 80 |
| G4 | Si—B—Ca—Zn—Al—Ti—Mg—O | 790 | 830 | 40 |
| G5 | Si—B—Ba—Zn—Al—Mg—La—O | 720 | 860 | 140 |
| G6 | Si—B—Ba—Zn—Al—Mg—La—O | 710 | 870 | 160 |
| G7 | Si—B—Ca—Al—Na—K—O | 800 | 890 | 90 |
| G8 | Si—B—Na—K—Ca—Al—O | 840 | — | — |
| G9 | Si—B—Na—K—Al—O | 760 | — | — |

TABLE 2

| Sample no. | Type |
|---|---|
| F1 | alumina |
| F2 | zirconia |
| F3 | partially stabilized zirconia |
| F4 | silicon nitride |
| F5 | silicon carbide |
| F6 | quartz |

[Preparation of Photosensitive Glass Paste]

A photosensitive glass paste was prepared by mixing the materials at the proportions described below. Specifically, the materials were weighed out at the proportions described below, and the weighed materials were stirred with a planetary mixer for 30 minutes. The mixture was kneaded by passing it through a 3-roll mill 4 times to prepare a photosensitive glass paste.

<Organic Component>
Alkali soluble polymer: methacrylic acid-methyl methacrylate copolymer, 24.7 parts by weight
Photosensitive monomer: trimethylolpropane triacrylate, 8.2 parts by weight
Solvent: pentamethylene glycol, 2.6 parts by weight
Photopolymerization initiator (1): 2-methyl-1-[4-(methylthio)phenyl]-2-morpholinopropan-1-one, 0.4 parts by weight
Photopolymerization initiator (2): 2,4-diethyl thioxanthone, 0.2 parts by weight
Photopolymerization initiator (3): bis(2,4,6-trimethylbenzoyl)phenyl phosphine oxide, 0.7 parts by weight
Yellow dye: Oil Yellow 129 (product name, available from Orient chemical industries Co., Ltd.), 0.2 parts by weight <Inorganic Component>
An inorganic powder having components at the proportions described in Table 3, total 63 parts by weight.

[Evaluation of Photosensitive Glass Paste]
(1) Evaluation of Insulation Resistance First, a conductive silver paste was applied to an alumina substrate (0.15 mm in thickness) having four sides of 4 inches (10.16 cm) by means of screen printing and dried at 90° C. for 10 minutes to form a film having a thickness of 10 μm. Subsequently, the film was fired at 850° C. in the air to form a lower conductor wire. Next, the photosensitive glass paste was applied to the alumina substrate having the lower conductor wire thereon, and dried at 60° C. for 10 minutes to form a film. The film was then fired at 850° C. in the air to form an insulating layer. Furthermore, an upper conductor wire was formed on the insulating layer by using the same processing method as for the lower conductor wire. The insulation resistance of the insulating layer, 12.6 mm$^2$ in inter-electrode area and 20 μm in thickness, thus formed was determined by using a resistance measuring device (R8340 Ultra High Resistance Meter, available from Advantest Corporation). The results are shown in Table 3. The reference value for evaluation is $7 \times 10^{10}$ Ω or more.

(2) Evaluation of Flexural Strength

First, the photosensitive glass paste was applied to an alumina substrate (0.15 mm in thickness) having four sides of 4 inches (10.16 cm) by means of screen printing and dried at 60° C. for 10 minutes to form a film having a thickness of 20 μm. To the formed film, the photosensitive glass paste was subsequently applied by means of screen printing and dried. The applying and drying process was repeated a total of 10 times to form a photosensitive glass paste film, 200 μm in thickness, on the alumina substrate. Next, the alumina substrate is cut into a size of 30 mm×3 mm by using a dicer, and the photosensitive glass paste film was released from the alumina substrate and then fired at 820° C. in the air to prepare a test piece. The flexural strength of the test piece thus prepared was measured by using an autograph (AGS-5kNX, available from Shimadzu Corporation). The results are shown in Table 3. The reference value for evaluation is 240 MPa or more.

TABLE 3

| | Glass Powder | | | | | | Ceramic filler | | | Insulation resistance [×10$^{10}$/Ω] | Flexural strength [MPa] |
|---|---|---|---|---|---|---|---|---|---|---|---|
| | Sample no. | Amount [wt %] | Amount [vol %] | Sample no. | Amount [wt %] | Amount [vol %] | Proportion [wt %] of glass powder having crystallization point | Sample no. | Amount [wt %] | Amount [vol %] | | |
| Example 1 | G2 | 67.1 | 75 | — | 0 | 0 | 100 | F1 | 32.9 | 25 | 31 | 250 |
| Example 2 | G2 | 52.5 | 61 | — | 0 | 0 | 100 | F1 | 47.5 | 39 | 26 | 270 |
| Example 3 | G7 | 52.5 | 61 | — | 0 | 0 | 100 | F1 | 47.5 | 39 | 38 | 275 |
| Example 4 | G5 | 74.2 | 75 | — | 0 | 0 | 100 | F1 | 25.8 | 25 | 53 | 300 |
| Example 5 | G5 | 64.0 | 65 | — | 0 | 0 | 100 | F1 | 36.0 | 35 | 49 | 350 |
| Example 6 | G5 | 58.9 | 60 | — | 0 | 0 | 100 | F1 | 41.1 | 40 | 41 | 330 |
| Example 7 | G6 | 74.2 | 75 | — | 0 | 0 | 100 | F1 | 25.8 | 25 | 42 | 290 |
| Example 8 | G5 | 61.0 | 70 | — | 0 | 0 | 100 | F2 | 39.0 | 30 | 38 | 280 |
| Example 9 | G5 | 60.5 | 70 | — | 0 | 0 | 100 | F3 | 39.5 | 30 | 29 | 300 |
| Example 10 | G5 | 72.0 | 70 | — | 0 | 0 | 100 | F4 | 28.0 | 30 | 34 | 295 |
| Example 11 | G5 | 73.4 | 70 | — | 0 | 0 | 100 | F5 | 26.6 | 30 | 22 | 285 |
| Example 12 | G5 | 72.7 | 65 | — | 0 | 0 | 100 | F6 | 27.3 | 35 | 47 | 250 |
| Example 13 | G5 | 63.4 | 60 | G8 | 9.0 | 15 | 87.6 | F1 | 27.6 | 25 | 48 | 305 |
| Example 14 | G5 | 59.4 | 55 | G8 | 15.0 | 20 | 79.8 | F1 | 25.6 | 25 | 39 | 275 |

TABLE 3-continued

| | Glass Powder | | | | | | Ceramic filler | | | | |
|---|---|---|---|---|---|---|---|---|---|---|---|
| | Sample no. | Amount [wt %] | Amount [vol %] | Sample no. | Amount [wt %] | Amount [vol %] | Proportion [wt %] of glass powder having crystallization point | Sample no. | Amount [wt %] | Amount [vol %] | Insulation resistance [×$10^{10}$/Ω] | Flexural strength [MPa] |
| Example 15 | G5 | 48.9 | 50 | — | 0 | 0 | 100 | F1 | 51.1 | 50 | 7 | 240 |
| Example 16 | G5 | 79.3 | 80 | — | 0 | 0 | 100 | F1 | 20.7 | 20 | 55 | 270 |
| Comparative Example 1 | G1 | 66.6 | 70 | — | 0 | 0 | 100 | F1 | 33.4 | 30 | 0.02 | 80 |
| Comparative Example 2 | G3 | 68.3 | 70 | — | 0 | 0 | 100 | F1 | 31.7 | 30 | 0.04 | 160 |
| Comparative Example 3 | G4 | 65.3 | 70 | — | 0 | 0 | 100 | F1 | 34.7 | 30 | 0.5 | 150 |
| Comparative Example 4 | G8 | 58.5 | 70 | — | 0 | 0 | 0 | F1 | 41.5 | 30 | 33 | 180 |
| Comparative Example 5 | G9 | 62.6 | 75 | — | 0 | 0 | 0 | F1 | 37.4 | 25 | 53 | 200 |

Table 3 shows that, in Examples 1 to 16, which satisfy the requirements of the present disclosure, the insulation resistance is as high as 7×$10^{10}$Ω or more and the flexural strength is as high as 240 MPa or more.

In Examples 4 to 14 and 16 where a $SiO_2$—$B_2O_3$—BaO—ZnO—$Al_2O_3$—MgO—$La_2O_3$ glass powder is used as a glass powder having a crystallization point and the amount of the glass powder is 49 wt % or more, the flexural strength is shown to be higher than that in Examples 1 to 3 and Example 15. In other words, it is shown that the presence of 49 wt % or more of a glass ceramic of which the difference between the crystallization point and the softening point is 140° C. or more can improve flexural strength. The comparison of Example 12 with Examples 4 to 11, 13, 14, and 16 indicates that high flexural strength is obtained in the case where a $SiO_2$—$B_2O_3$—BaO—ZnO—$Al_2O_3$—MgO—$La_2O_3$ glass powder is used as a glass powder having a crystallization point, the amount of the glass powder is 49 wt % or more, and one selected from alumina, zirconia, partially stabilized zirconia, silicon nitride, and silicon carbide is used as a ceramic filler.

In Comparative Examples 1 to 3 where the difference between the crystallization point and the softening point of the glass powder having a crystallization point is less than 85° C., the insulation resistance and the flexural strength are both shown to be low. This may be because crystallization starts at almost the same time as the glass starts to soften and thus a dense sinter is not obtained. In Comparative Examples 4 and 5 where an amorphous glass powder having no crystallization point is used, the high insulation resistance is shown to be high due to a dense sinter, but the flexural strength is shown to be low.

The present disclosure is not limited to the embodiment and Examples described above, and various adaptations and modifications can be made to the composition of glass powder, the type of ceramic filler, the proportions of the glass powder and the ceramic filler, the type of photosensitive organic component, the proportion of the photosensitive organic component, and the like, without departing from the scope of the present disclosure.

What is claimed is:

1. A photosensitive glass paste comprising:
a photosensitive organic component; and
an inorganic component containing a glass powder and a ceramic filler,
wherein
the glass powder contains a glass powder having a crystallization point,
a difference between the crystallization point and a softening point of the glass powder having a crystallization point is from 85° C. to 180° C., and
the glass powder has a softening point of 710° C. or higher and 810° C. or lower.

2. The photosensitive glass paste according to claim 1, wherein
the glass powder having a crystallization point is a $SiO_2$—$B_2O_3$—BaO—ZnO—$Al_2O_3$—MgO—$La_2O_3$ glass powder.

3. The photosensitive glass paste according to claim 2, wherein
the ceramic filler is at least one selected from the group consisting of alumina, zirconia, partially stabilized zirconia, silicon nitride, and silicon carbide.

4. The photosensitive glass paste according to claim 2, wherein
an amount of the ceramic filler in the inorganic component is from 25 wt % to 48 wt %.

5. The photosensitive glass paste according to claim 2, wherein
a proportion of the glass powder having a crystallization point in an entirety of the glass powder is 80 wt % or more.

6. The photosensitive glass paste according to claim 5, wherein
the ceramic filler is at least one selected from the group consisting of alumina, zirconia, partially stabilized zirconia, silicon nitride, and silicon carbide.

7. The photosensitive glass paste according to claim 5, wherein
an amount of the ceramic filler in the inorganic component is from 25 wt % to 48 wt %.

8. The photosensitive glass paste according to claim 1, wherein
a proportion of the glass powder having a crystallization point in an entirety of the glass powder is 80 wt % or more.

9. The photosensitive glass paste according to claim 1, wherein
the ceramic filler is at least one selected from the group consisting of alumina, zirconia, partially stabilized zirconia, silicon nitride, and silicon carbide.

10. The photosensitive glass paste according to claim 1, wherein
an amount of the ceramic filler in the inorganic component is from 25 wt % to 48 wt %.

11. An electronic component comprising a conductor layer and an insulating layer formed of a fired product of the photosensitive glass paste according to claim 1.

12. The electronic component according to claim 11, further comprising:
an insulating layer formed of an amorphous glass having no crystallization point.

13. A method for producing an electronic component, the method comprising:
    forming an insulating layer by using the photosensitive glass paste according to claim 1; and
    forming a conductor layer on the insulating layer by using a conductor paste.

* * * * *